United States Patent
Osborn et al.

(10) Patent No.: US 10,778,229 B1
(45) Date of Patent: Sep. 15, 2020

(54) LOGIC GATES WITH FLUX SOLITONS

(71) Applicant: The Government of the United States as represented by the Director, National Security Agency, Ft. George G. Meade, MD (US)

(72) Inventors: Kevin D. Osborn, Clarksville, MD (US); Waltraut Wustmann, Dunedin (NZ)

(73) Assignee: U.S. Government as represented by the Director, National Security Agency, Washington, DC (US)

(*) Notice: Subject to any disclaimer, the term of this patent is extended or adjusted under 35 U.S.C. 154(b) by 0 days.

(21) Appl. No.: 16/806,391

(22) Filed: Mar. 2, 2020

Related U.S. Application Data (60) Provisional application No. 62/813,378, filed on Mar. 4, 2019.

(51) Int. Cl.
*H03K 19/195* (2006.01)
*G06N 10/00* (2019.01)
*H03K 19/20* (2006.01)

(52) U.S. Cl.
CPC .......... *H03K 19/195* (2013.01); *G06N 10/00* (2019.01); *H03K 19/20* (2013.01)

(58) Field of Classification Search
CPC ....... H03K 19/195; H03K 19/20; G06N 10/00
USPC ............................................................ 326/4
See application file for complete search history.

(56) References Cited

U.S. PATENT DOCUMENTS

| | | | | |
|---|---|---|---|---|
| 6,331,805 | B1* | 12/2001 | Gupta | H03B 15/00 327/528 |
| 10,331,163 | B1* | 6/2019 | Luo | H03K 3/38 |
| 2002/0169079 | A1* | 11/2002 | Suzuki | H03K 19/1954 505/100 |
| 2002/0177529 | A1* | 11/2002 | Ustinov | G06N 10/00 505/100 |
| 2005/0035368 | A1* | 2/2005 | Bunyk | H04L 49/1507 257/123 |
| 2006/0290553 | A1* | 12/2006 | Furuta | H03K 5/24 341/155 |

(Continued)

OTHER PUBLICATIONS

Ren, J. et al.; Progress with Physically and Logically Reversible Superconducting Digital Circuits; IEEE Transactions on Applied Superconductivity; 2011; pp: 780-786; vol. 21, Issue 3; IEEE/CSC & ESAS European Superconductivity News Forum (ESNF); No. 15, Jan. 2011.

(Continued)

*Primary Examiner* — Don P Le (57) ABSTRACT

A CNOT gate includes a clock line, splitter, and first and second store-and-launch gates (SNLs) to each output a fluxon in accordance with a clock fluxon and polarities of an input fluxon and the clock fluxon. The CNOT gate also includes first and second IDSN gates. When one fluxon input is received, the IDSN gate outputs one fluxon in accordance with a polarity of the fluxon input. When two fluxon inputs are received, the IDSN gate outputs two fluxons in accordance with an inverse polarity of the fluxon inputs. The CNOT gate also includes first and second NOT gates to receive a fluxon output from the first IDSN gate and output a fluxon of opposite polarity, and a third NOT gate to receive a fluxon output from the second IDSN gate and output a fluxon of opposite polarity.

18 Claims, 10 Drawing Sheets

(56) References Cited

U.S. PATENT DOCUMENTS

2011/0065586 A1* 3/2011 Maibaum ............... B82Y 10/00
 505/170
2017/0359072 A1* 12/2017 Hamilton ............. H03K 19/195

OTHER PUBLICATIONS

Takeuchi, N. et al.; Reversibility and energy dissipation in adiabatic superconductor logic; Scientific Reports; 2017; pp. 1-12; vol. 7; Article 75; www.nature.com/scienfiticreports.

* cited by examiner

(See parameter values at Fig. 6)

Fig. 4

| IDSN input A B | IDSN output A' B' |
|---|---|
| N N (N=no fluxon) | N N |
| N 0 | N 0 |
| N 1 | N 1 |
| 0 N | 0 N |
| 1 N | 1 N |
| 0 0 | 1 1 |
| 1 1 | 0 0 |

Fig. 5

| Parameter | IDSN 1: regular margins, See Fig. 3 | | | IDSN 2: increased margins, see Fig. 7 | | | IDSN 3: with left-to-right dc isolation, see Fig. 10 | | |
|---|---|---|---|---|---|---|---|---|---|
| | Ideal Value | Lower Margin | Upper Margin | Ideal Value | Lower Margin | Upper Margin | Ideal Value | Lower Margin | Upper Margin |
| $I_0'/I_0$ | 1.2 | 1.11 | 1.40 | 1.5 | 0.80 | 1.94 | 2.1 | 1.79 | 2.48 |
| $C_J'/C_J$ | 6.0 | 5.28 | 6.36 | 5.8 | 5.57 | 6.15 | 4.0 | 3.48 | 4.68 |
| $I_{0A}/I_0$ | 2.4 | 2.11 | 2.57 | 1.5 | 1.20 | 1.73 | — | — | — |
| $C_A/C_J$ | 9.0 | 8.10 | 9.90 | 15.0 | 14.2 | 15.7 | 16.0 | 12.3 | 22.6 |
| $I_{0B}/I_0$ | 4.9 | 4.66 | 5.01 | 6.9 | 6.53 | 7.43 | — | — | — |
| $C_B/C_J$ | 21.3 | 20.1 | 25.6 | 16.7 | 14.2 | 19.0 | 3.5 | 2.66 | 5.32 |
| $L_B/L$ | — | — | — | 0.5 | 0.20 | 0.78 | — | — | — |

(See parameter values at Fig. 6)

(See parameter values at Fig. 6)

LOGIC GATES WITH FLUX SOLITONS

CROSS REFERENCE TO RELATED APPLICATIONS

This application claims priority to provisional patent application Ser. No. 62/813,378, filed Mar. 4, 2019, titled "Logic Gates with Flux Solitons," naming Kevin. Osborn and Waltraut Wustmann as inventors, the contents of which are hereby incorporated by reference herein in their entirety.

FIELD OF THE INVENTION

The present invention relates generally to reversible computing, and in particular to circuitry for implementing reversible computing using flux solitons.

SUMMARY

One embodiment of the present invention is a CNOT gate for use in a reversible fluxon logic circuit. The CNOT gate includes a clock line, configured to transmit an input clock fluxon, and a splitter, connected to the clock line, configured to receive the input clock fluxon and to transmit a first clock fluxon and a second clock fluxon. The first clock fluxon and the second clock fluxon are synchronized in time. The gate also includes a first store-and-launch gate (SNL), configured to receive the first clock fluxon from the splitter, to receive a first input fluxon from a first input line, and to transmit a first output fluxon. The first output fluxon is transmitted at a time in accordance with the first clock fluxon. The first output fluxon is transmitted on an output line in accordance with a polarity of the first input fluxon and a polarity of the first clock fluxon. The gate also includes a second store-and-launch gate, configured to receive the second clock fluxon from the splitter, to receive a second input fluxon from a second input line, and to transmit a second output fluxon. The second output fluxon is transmitted at a time in accordance with the second clock fluxon. The second output fluxon is transmitted on an output line in accordance with a polarity of the second input fluxon and a polarity of the second clock fluxon. The gate also includes a first IDSN gate, configured to receive up to two fluxon inputs and, in the event exactly one fluxon input is received, output exactly one fluxon in accordance with a polarity of the exactly one fluxon input of the first IDSN gate, and in the event two fluxon inputs of the same polarity are received, output two fluxons in accordance with an inverse polarity of the two fluxon inputs of the first IDSN gate. The gate also includes a second IDSN gate, configured to, in the event exactly one fluxon input is received, output exactly one fluxon in accordance with a polarity of the exactly one fluxon input of the second IDSN gate, and in the event two fluxon inputs of the same polarity are received, output two fluxons in accordance with an inverse polarity of the two fluxon inputs of the second IDSN gate. The gate also includes a first NOT gate and a second NOT gate, each configured to receive a fluxon output from the first IDSN gate and to output a fluxon of opposite polarity from what was received, and a third NOT gate configured to receive a fluxon output from the second IDSN gate and to output a fluxon of opposite polarity from what was received. The inputs of the first store-and-launch gate and the second store-and-launch gate and the outputs of the first IDSN and the second IDSN implement a CNOT function.

In a related embodiment, each of the first IDSN gate and the second IDSN gate includes a first input Long Josephson Junction (LJJ) having first and second output terminals and a second input LJJ having first and second output terminals. The first output terminal of the second input LJJ is shorted to the second output terminal of the first input LJJ. The IDSNs also include a first output LJJ having first and second input terminals and a second output LJJ having first and second input terminals. The first input terminal of the second output LJJ is shorted to the second input terminal of the first output LJJ. The IDSNs also include a first capacitance-shunted Josephson Junction (csJJ) connected to the first and second output terminals of the first input LJJ, a second csJJ connected to the first and second output terminals of the second input LJJ, a third csJJ connected to the first and second input terminals of the first output LJJ, a fourth csJJ connected to the first and second input terminals of the second output LJJ, a fifth csJJ connected to the first output terminal of the first input LJJ and the first input terminal of the first output LJJ, a sixth csJJ connected to the second output terminal of the second input LJJ and the second input terminal of the second output LJJ, and a seventh csJJ connected to the second output terminal of the first input LJJ and the second input terminal of the first output LJJ.

Another embodiment is a store-and-launch gate (SNL), including a first input LJJ having first and second output terminals, a second input LJJ having first and second output terminals, a clock input LJJ having first and second output terminals, a first output LJJ having first and second input terminals, a second output LJJ having first and second input terminals, and a superconducting wiring path configured to form a flux storage loop. The superconducting wiring path includes wiring from the first output terminal of the first input LJJ to the first input terminal of the first output LJJ by a first inductor, wiring from the second input terminal of the first output LJJ to the second terminal of a capacitor by a second inductor, wiring from the first input terminal of the second output LJJ to the second terminal of the capacitor by a third inductor, wiring from the second output terminal of the second input LJJ to the second input terminal of the second output LJJ by a fourth inductor, and wiring from the second output terminal of the first input LJJ to the first output terminal of the second input LJJ by a fifth inductor. The flux storage loop includes launch circuitry configured to launch stored flux when energy from a clock fluxon reaches the capacitor via the clock input LJJ. The launch circuitry includes wiring from the first output terminal of the input clock LJJ to the second terminal of the capacitor by a sixth inductor, wiring from the second output terminal of the input clock LJJ to the first terminal of the capacitor by a seventh inductor, wiring from the first output terminal of the first input LJJ to the first terminal of the capacitor by a first resistor, and wiring from the second output terminal of the second input LJJ to the first terminal of the capacitor by a second resistor.

DETAILED DESCRIPTION

Energy used per switch in industrial logic, e.g., semiconducting CMOS logic, is no longer reducing very fast. Unfortunately, the reduction is now very slow relative to Moore's-law scaling. This logic is irreversible logic and is designed with a minimum energy per switch which depends on the connected wiring. In the future, consumers will want logic with substantially improved energy efficiency for reduced power in computing.

Most superconducting logic is single flux quanta logic where a bit state (1 for example) is encoded as a flux quanta that may be annihilated when the bit state changes. This is not an energy conservative process. It thus requires external energy to reconstitute the original state or to progress computing. Irreversible functions use physical processes which do not conserve energy.

Only reversible logic may be designed around an energy conserving process. For example, it may preserve the logical states. An example for this is the adiabatic reversible logic class, which uses an adiabatic clock waveform for computing. It includes, e.g., reversible implementations of the Quantum Flux Parametron from Yokohama National University and N-SQUID logic from the University of Stonybrook.

We define a "fluxon" to be a flux soliton in a Long Josephson Junction (LJJ). We reserve the word "fluxon" for our usage: the steady-profile flux quanta within an LJJ. It will be changed near the termination of the LJJ by the influence of the termination. The fluxon is typically a couple of Josephson penetration depths long. The more general term for quantized flux in superconducting circuits is flux quanta or a fluxoid, which can apply when the fluxon is significantly changed. This is appropriate when the fluxon reaches near the end of an LJJ and its profile changes. We use an LJJ for the first time in our works as a necessary and integrated component of logic gates. This means that it cannot be replaced with the standard Josephson Transmission Lines to achieve the same gate function.

However, it has recently been demonstrated that the fluxon gates can have near ideal energy conservation by encoding the bit state in the fluxon polarity. This type of gate consists of LJJs connected by an interface (such that end sections of the LJJs and the interface together comprise the gate). The gates are ballistic in that they are solely powered by the input energy of the fluxons which travel towards gates under inertia (and encode the bit states). The fluxon(s) approach the gate as bit state 0 with positive polarity (as a fluxon) or bit state 1 with negative flux polarity (as a antifluxon).

Figure 1:
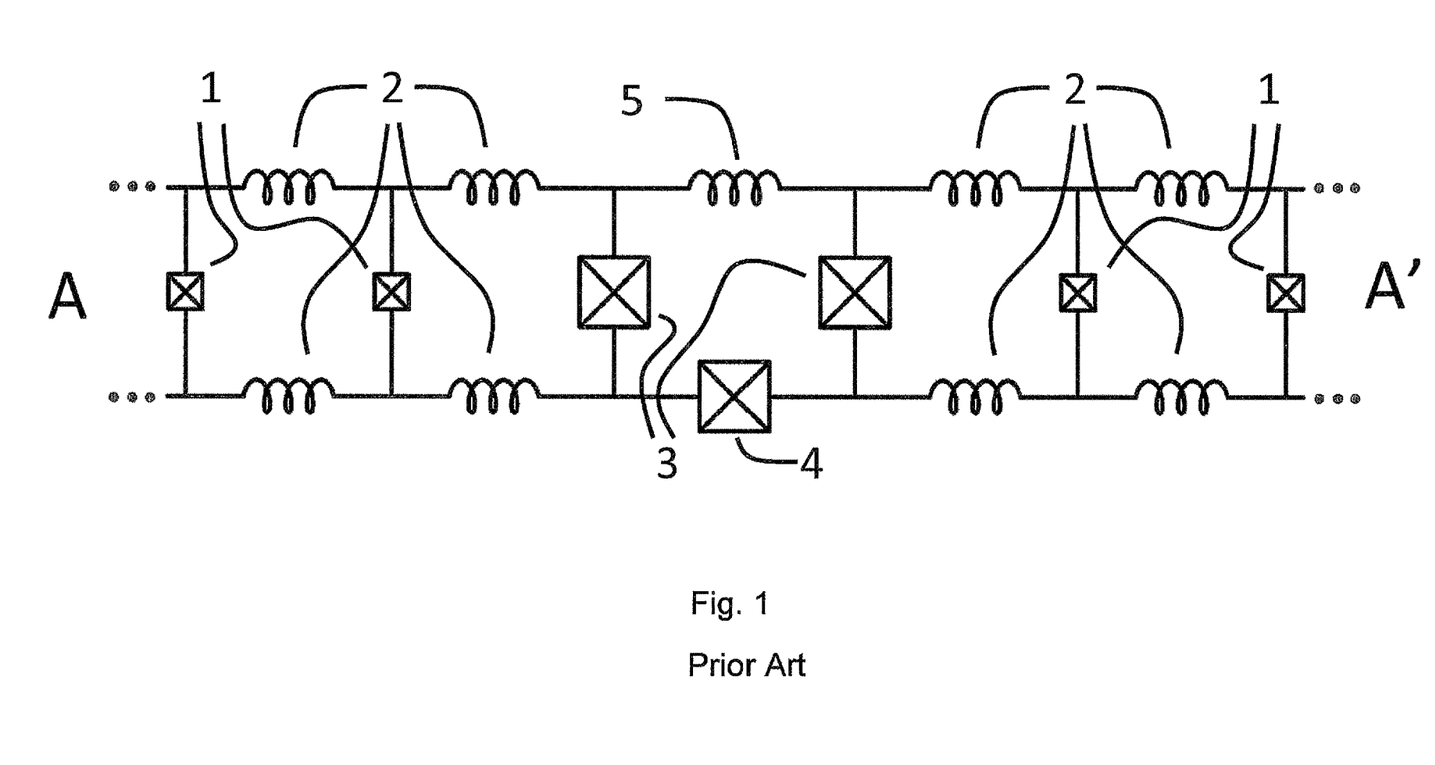
FIG. 1 is a circuit schematic of a prior art 1-bit logic gate.

A fundamental one-bit gate is shown in FIG. 1. It is fundamental to the logic because the physical dynamics are used in other more complex gates of this logic class. As shown, a left LJJ is defined for a fluxon that may enter with bit state A. It has sections of inductors L. It also contains regular Josephson junctions (JJs) which have critical currents $I_0$ and as-fabricated capacitances $C_J$. They make up a structure that acts as a nearly continuous LJJ because $L \ll \Phi_0/(2\pi I_0)$, where $\Phi_0$ is the superconducting flux quantum. Instead one could replace the discrete LJJ with an actual long Josephson junction which is continuous. In accordance with this embodiment, $7L = \Phi_0/(2\pi I_0)$. An LJJ with JJs 1 having the same values of critical current and capacitance and same inductance values of inductors 2 is used for bit state A' which may result after the input of A. The interface has three different JJs 3, 4 and a negligibly small value inductor 5. The two JJs 3 have one value of critical current and capacitance, and JJ 4 may have different values.

For the gates to operate as intended, they need particular chosen values for the parameters. JJ 4 and JJs 3 generally have a large ratio of capacitance to critical current relative to a standard JJ within the LJJ $C_J/I_0$. As a result, it will generally be made with an external capacitor shunting the as-fabricated JJ, or a capacitatively-shunted Josephson junction.

Figure 2:
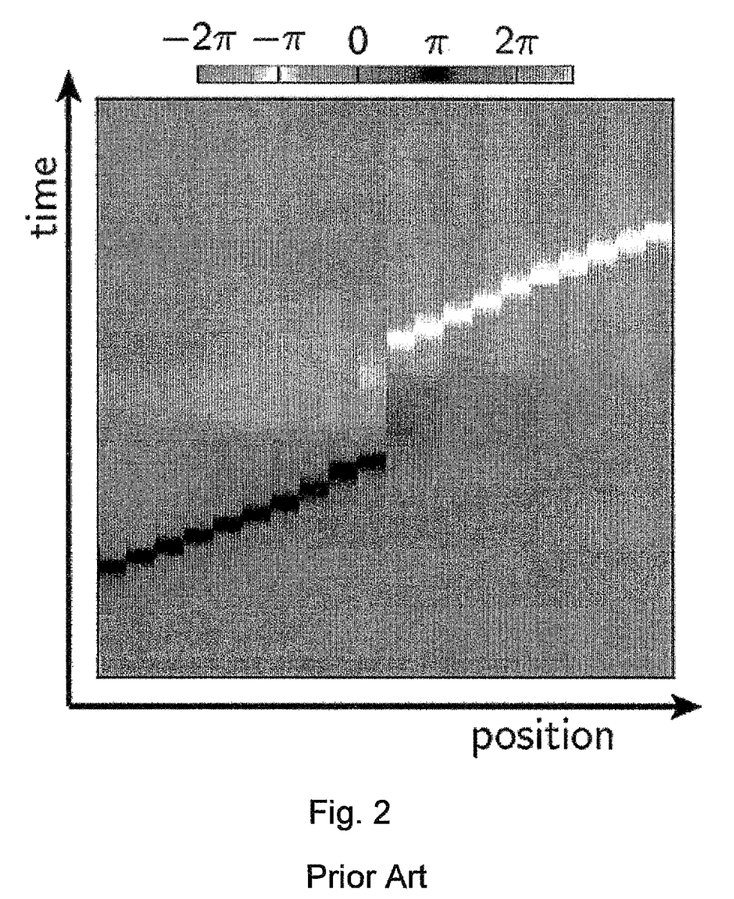
FIG. 2 is a graph illustrating gate dynamics in a prior art NOT gate.

The proper NOT gate dynamics of the fundamental gate are shown in FIG. 2. It generally has a fluxon of one polarity approaching the interface. In the example, the JJs of the gate initially have all zero phases, but a fluxon approaching from the left of the interface with a particular velocity changes phases by $2\pi$ on the left. When the fluxon gets close enough to the interface it changes into another type of excitation. It produces a short-duration resonance at the interface with the LJJ ends. Finally, it results in an antifluxon that propagates out from the interface to the right. The large shunt capacitances of JJs 3, 4 in FIG. 1 allow resonances to achieve the gate dynamics for a particular function. The parameter values are chosen such that the dynamics will produce a fluxon that exits to the right after being input (under their own inertia) from the left. In FIG. 2 this is a NOT gate because the polarity changes. This causes the phase across the right LJJ to wrap from 0 to $-2\pi$. The output fluxon velocity can be a large fraction of the input fluxon velocity. Even when the output velocity is only 50% of the input velocity, the output fluxon conserves most of the energy because the static fluxon energy (a potential or rest energy) is large compared to the kinetic energy. In other words, if a fluxon exits at all in the forward direction, most of the energy of the bit is conserved because all of the potential (or rest mass) energy is preserved. With different values of parameters in the interface the gate can change to an Identity gate. This shows the ability of a fundamental structure to change its operation without a schematic change. The structure has left-right symmetry such that the description of input from the left is merely used for a definite description. In practice, the fluxons could travel in from the right and exit to the left.

A general 2-bit gate schematic has also been presented, along with a basic gate type: the NSWAP gate. The inventors have appreciated that, by utilizing the previous layout of the NSWAP gate, but by utilizing different parameter values for the circuit components (as is described in detail below with reference to FIG. 6), a new type of gate can be created. This new gate is referred to as an Identity-Same-Not gate, or an IDSN. The IDSN, in turn, can be used as a component in a novel type of CNOT gate (as is described in detail below with reference to FIG. 4). A schematic of the IDSN is given in FIG. 3. As shown, the upper left LJJ allows bit state A to enter the gate under its own inertia. It again includes sections of inductors L and short JJs which have critical current $I_0$ and capacitance $C_J$. JJs 1 having the same values of critical current and capacitance and same inductance values of inductors 2 is used for bit state A'. LJJs with the same parameter values are below these LJJs for bit states B and B'. In this gate there is an interface with 7 JJs 3, 4, 5. There is negligible inductance in wiring that connects them. The 4 JJs 3 share common values of critical current and capacitance which we designate $I_0'$ and $C_J'$, respectively. At the edges of the circuit there is also a JJ 4 with critical current and capacitance of $I_{OA}$ and $C_A$, respectively. There is also a central JJ 5 with critical current and capacitance of $I_{OB}$ and $C_B$, respectively. Generally, external capacitance is added to the 7 as-fabricated JJs with critical current $I_0'$, $I_{OA}$ and $I_{OB}$ to achieve large needed values of $C_J'$, $C_{JA}$ and $C_{JB}$. This adds capacitance relative to the JJs in the $L_B$, which have a lower and particular ratio of capacitance to critical current $C_J/I_0$.

Figure 4:
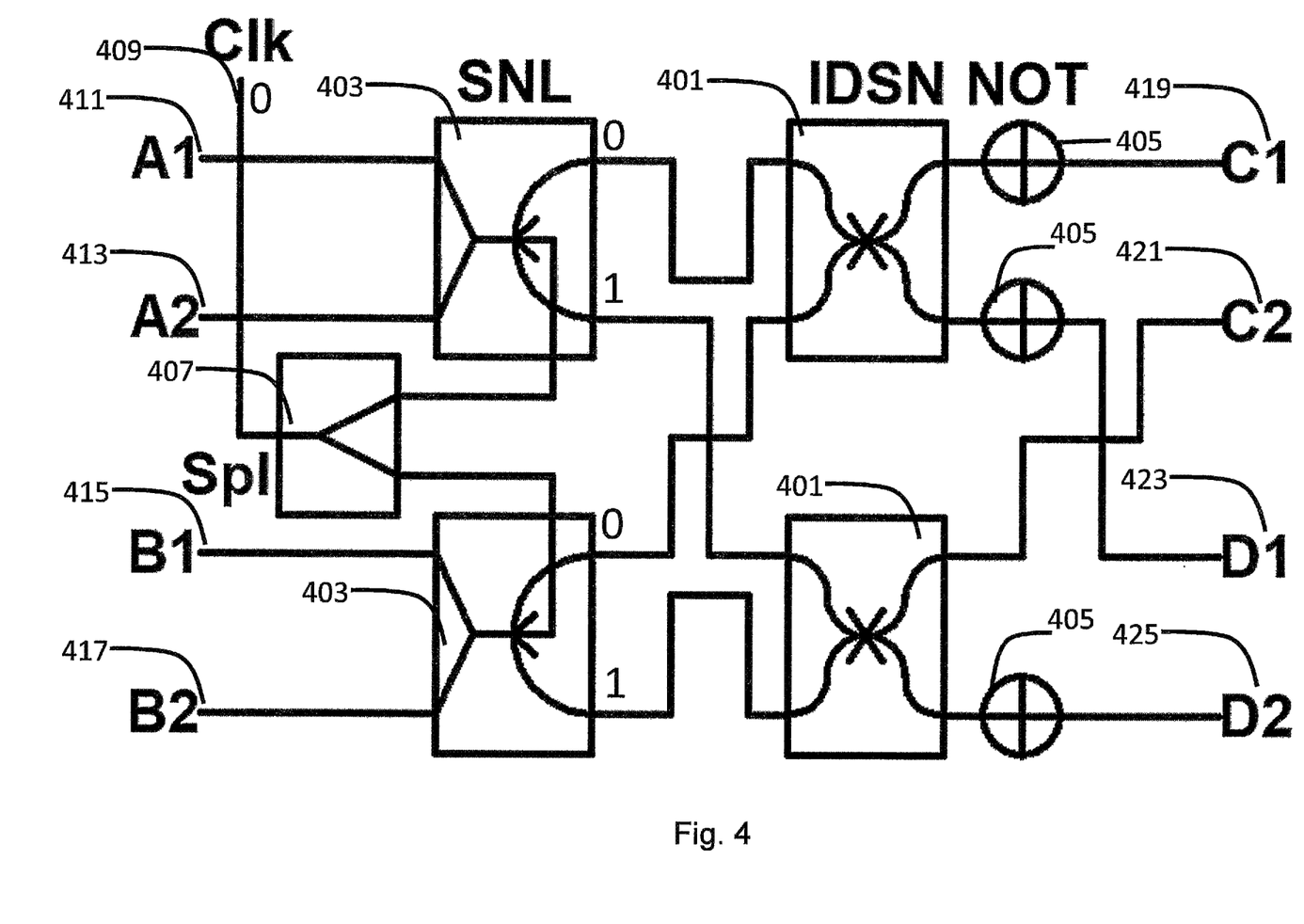
FIG. 4 is a block diagram of a CNOT gate in accordance with an embodiment of the present invention.

The new schematic shown in FIG. 4 describes how to build the CNOT function in a reversible fluxon logic. It has many gates within it including two IDSN gates 401, two Store and Launch (SNL) gates 403, NOT gates 405 and a Splitter 407 (Spl). Lines outside of these gate symbols are actually LJJs and they only connect two points, thus crossings of these lines don't connect.

Operation of the CNOT is as follows: fluxons flow generally to the right (it may travel upward or downward, but is shown to never flow to the left). First, one data fluxon (fluxon for bit state 0 or antifluxon for bit state 1) enters from the left, traveling under its own intertia, on either on the A1 411 or A2 413 LJJ (but not both). At a similar time, a data fluxon enters from the left, traveling under its own intertia, on either the B1 415 or B2 417 LJJ (but not both). Those bit states are damped within the SNL and are stored as a static flux in their own respective SNL gates. After that, a clock fluxon enters at Clk 409, traveling under its own inertia. Here we mainly discuss the case in which it enters with positive polarity, which is marked with a zero in the schematic.

The clock fluxon enters the split gate 407 and gets split into two half-energy fluxons that come out to the right with negligible change in speed. This provides synchronization of two fluxons from one. This phenomenon is well known to people who study the sine-Gordon equation or LJJs. A splitter is merely the joining of one LJJ to two LJJs of double the impedance through a T-junction. This operates for fluxons in this nonlinear system in an energy conserving process similar to a microwave (quasi-TEM wave) splitter.

As the split clock fluxons with low energy simultaneously enter the two SNL gates they convert the existing static flux and circulating current, encoding a data bit, into a traveling fluxon. If the data bit state stored is 0 it launches a fluxon to the right out of the LJJ marked with zero, but if the data bit state is 1, it launches an antifluxon to the right out of the LJJ marked with 1.

This effectively routes the bits that had entered the SNL, because there are two paths. However, the path out of the SNL switches if the clock fluxon switches polarity (as well as if the data state is switched).

The fluxons then travel under their own inertia with a fixed distance to an IDSN 401 gate, regardless of the path they take. After traveling, that fluxon (or bit) is processed by the IDSN and the result is encoded in fluxons traveling out the LJJs to the right. The IDSN is a ballistic gate similar to the fundamental NOT, IDentity, and NSWAP gates, thus the result is output as a fluxon with polarity encoding the result, traveling under its own inertia. Those bits may next encounter a NOT 405 gate which can be the fundamental NOT gate or a half twist in the LJJ line to invert polarity. The result comes to either C1 419 or C2 421 (but not both) as the C bit and D1 423 or D2 425 (but not both) as the D bit.

Figure 5:
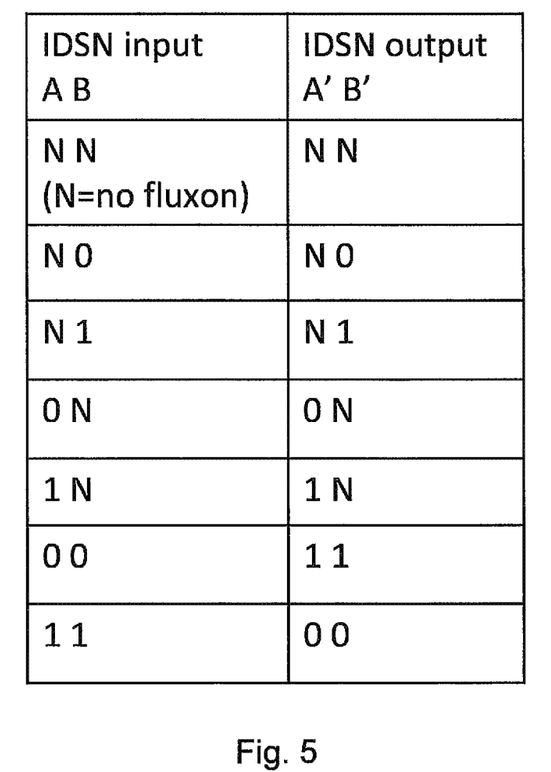
FIG. 5 is a logic table defining operations of an IDSN gate in accordance with an embodiment of the present invention.

The logic table in FIG. 5 shows the action of the IDSN. If one bit enters, it exits with the same state. This is the "ID" (identity) part of the IDSN name. However, if two bits enter simultaneously with the same polarity, within timing margins, the bits will exit with inverted polarity in a NOT operation. This is the "SN" (same-not) part of the IDSN name.

Now we can understand the operation of the CNOT gate. Case 1: If the bit input states are (A,B)=(0,0) the result travels to (C1 419, D1 423). In this case the upper IDSN processing both entering bits with a not operation since they have the same polarity and simultaneous input. There are two NOTs afterward such that the final result is (C,D)=(0,0). Case 2: If the input states are (A,B)=(1,1) the result travels to (C2 421, D2 425). In this case, the lower IDSN produces a NOT operation on both bits because they have the same polarity and simultaneous input. Afterwards, a NOT appears only on the D2 425 bit line but not the C2 421 one, such that the result is (C,D)=(0,1). Case 3: If the input states are (A,B)=(0,1) the result travels to (C1 419, D2 425). In this case, both IDSN produce the ID operations and both have a subsequent NOT operation such that the result is (C,D)=(1, 0). Case 4: If the input states are (A,B)=(1,0) the result travels to (C2 421, D1 423). In this case, both IDSN produce the ID operations and only the result coming to C2 421 has a NOT operation after the IDSN such that the result is (C,D)=(1,1).

Note that the combined output result is D=A and C=A+B (using modulo 2 arithmetic). Thus this is the CNOT gate. To reverse the state a subsequent gate can be performed, where the result D is fed to the second CNOT's A and C is fed to the second CNOT's B.

The IDSN is ballistic and can be extremely energy efficient. We present multiple different IDSN because they have different parameter margins and synchronous requirements, and one may choose a different one based on system requirements. We now use the structural layout of FIG. 3 with new specific parameter values to realize an entirely new function. The function is nonlinear unlike the NSWAP gate. We call this function and gate the IDSN. The function is one where if a fluxon is received within a range of velocities it will produce the ID gate on that fluxon, by receiving a fluxon on exactly one of the first or second input LJJs from the left and outputting a fluxon of the same polarity on exactly one of the first or second output LJJs to the right. In contrast, if the IDSN gate receives two fluxons simultaneously from the left on the two input LJJs with the same polarity it will output two fluxons of opposite polarity relative to the input fluxons. The structure has left-right symmetry such that the description of input from the left is merely used for a definite description—in practice the fluxons could travel in from the right and exit to the left.

Figure 3:
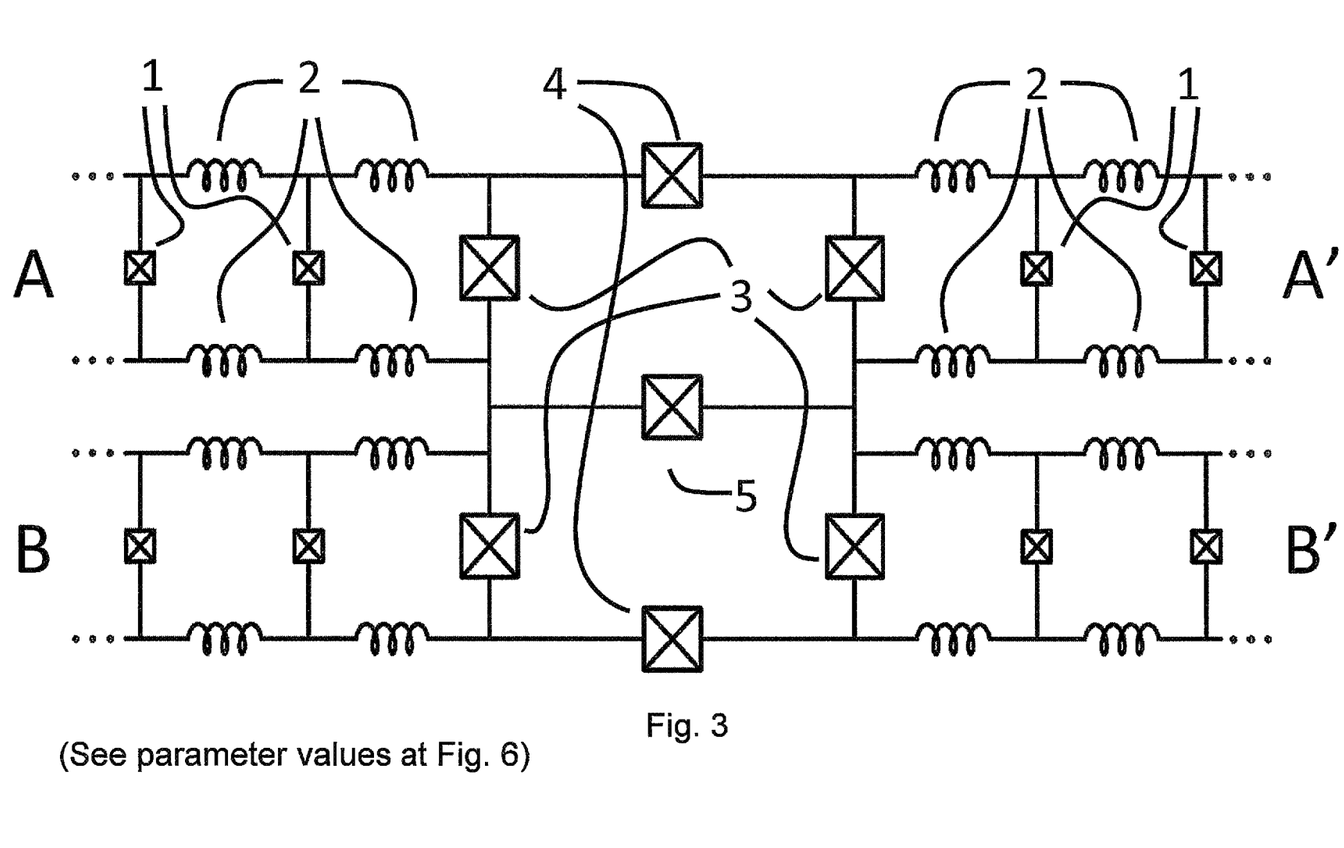
FIG. 3 is a circuit diagram of an Identity-Same-Not (IDSN) logic gate.
Figure 6:
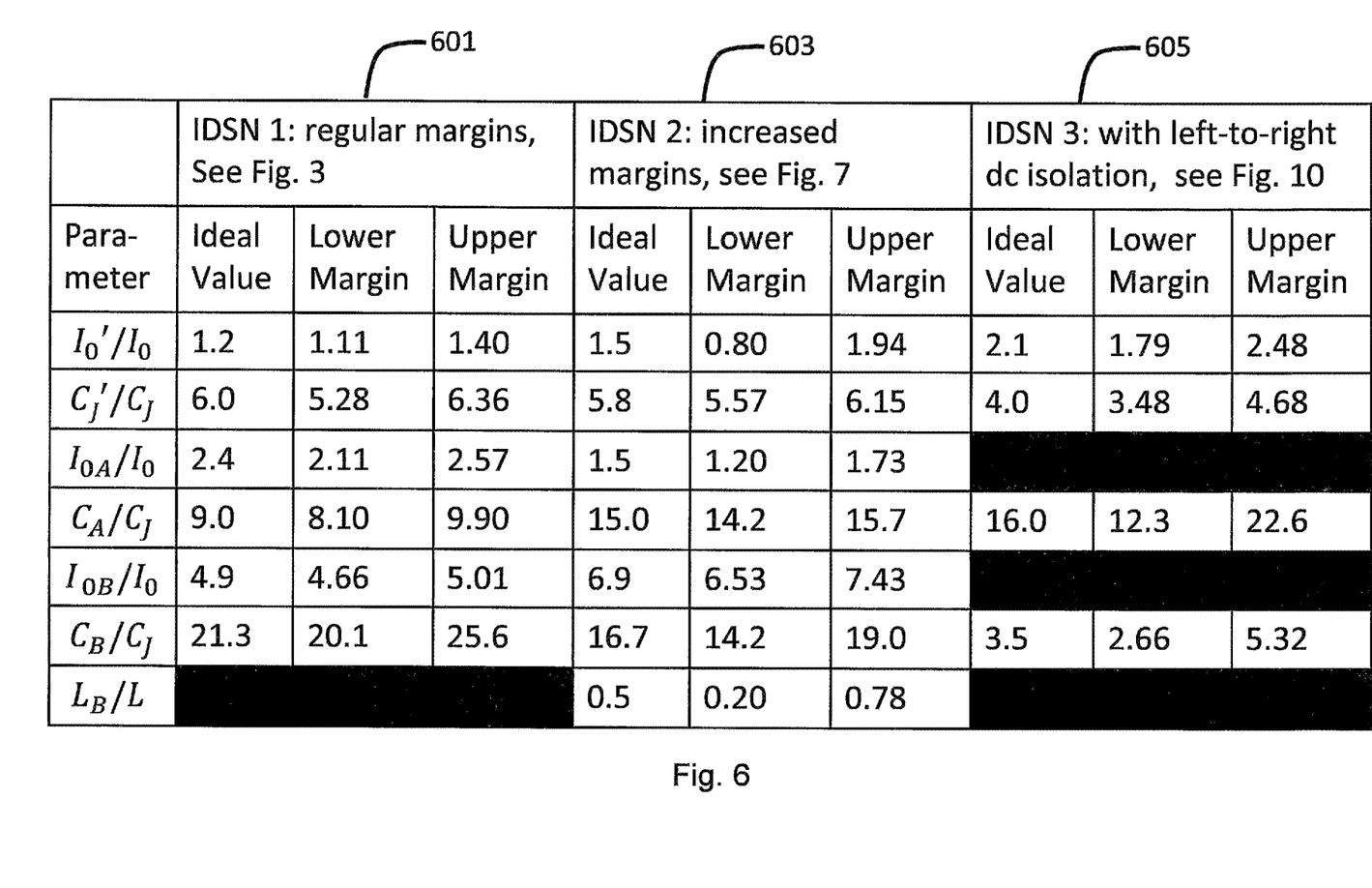
FIG. 6 is a table of parameter values and margins for an IDSN gate in accordance with an embodiment of the present invention.
Figure 7:
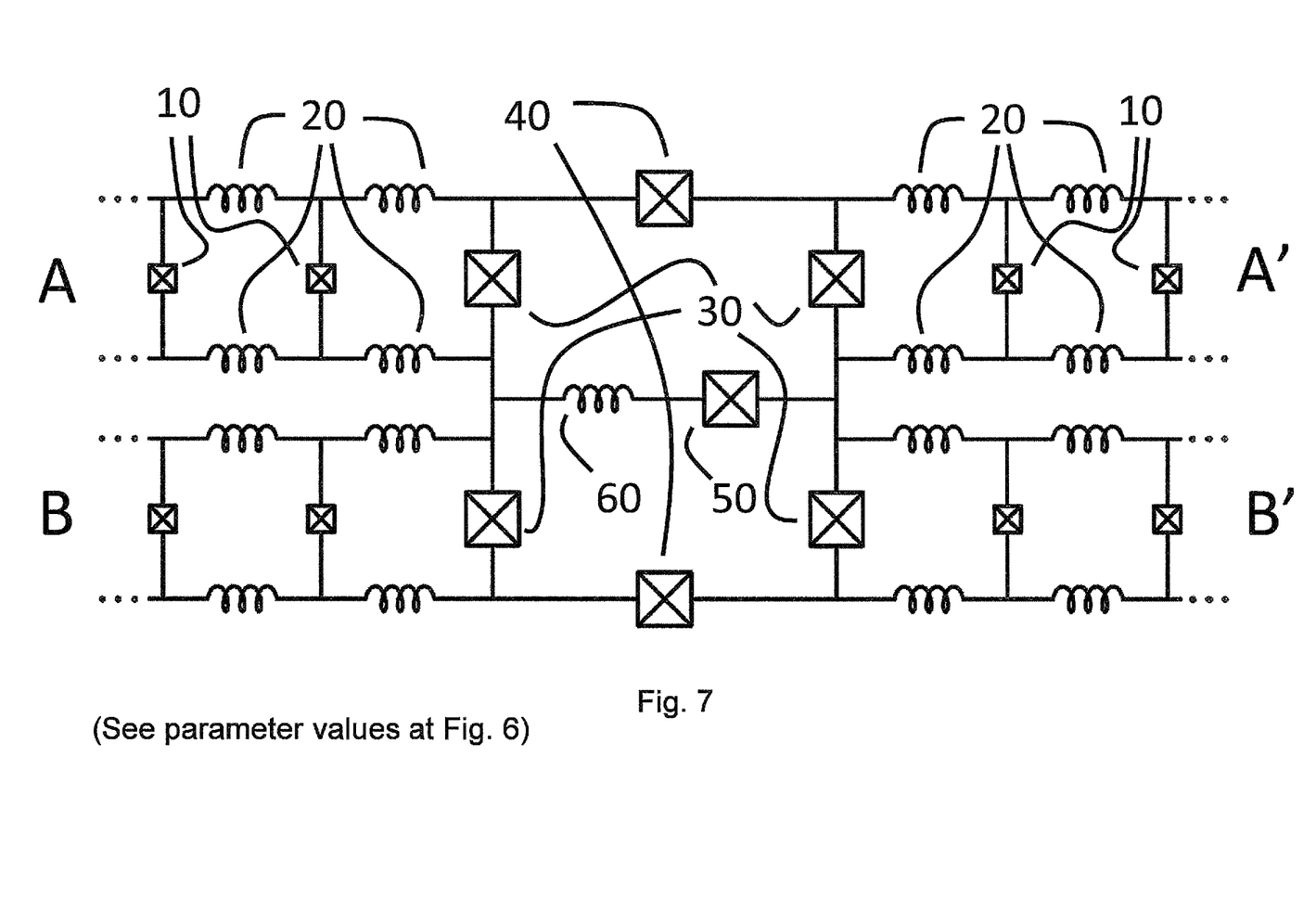
FIG. 7 is a circuit diagram of an IDSN gate in accordance with an embodiment of the present invention.

In FIG. 6, section 601 gives the optimum values for the IDSN gate for FIG. 3, given by values of the output velocity greater than 80% of the input velocity. Our results are shown for an input velocity of 0.6 times the Swihart velocity, which is the maximum theoretical velocity for a fluxon in an ideal LJJ. With reference to FIG. 7, inductors 20 have an inductance value of L, while JJs 10 have a critical current $I_0$ and as-fabricated capacitance $C_J$. We assume an L to $\varphi_0/2\pi*I_0$ ratio of 1/7 in the LJJ for definiteness. All other elements have capacitive shunts in the elements. Capacitively-shunted JJs 30 (csJJs) have critical current $I_0'$ and capacitance $C_J'$. The csJJs 40 have critical current $I_{OA}$ and capacitance $C_A$. The csJJ 50 has critical current $I_{OB}$ and capacitance $C_B$.

FIG. 7 is an augmented version of the IDSN for better parameter margins. This IDSN includes a supplemental inductor 60 having an inductance $L_B$. Parameters for this gate are given in FIG. 6 in section 603, where the acceptable ranges are increased relative to the margins in section 601 corresponding to the IDSN of FIG. 3.

Figure 10:
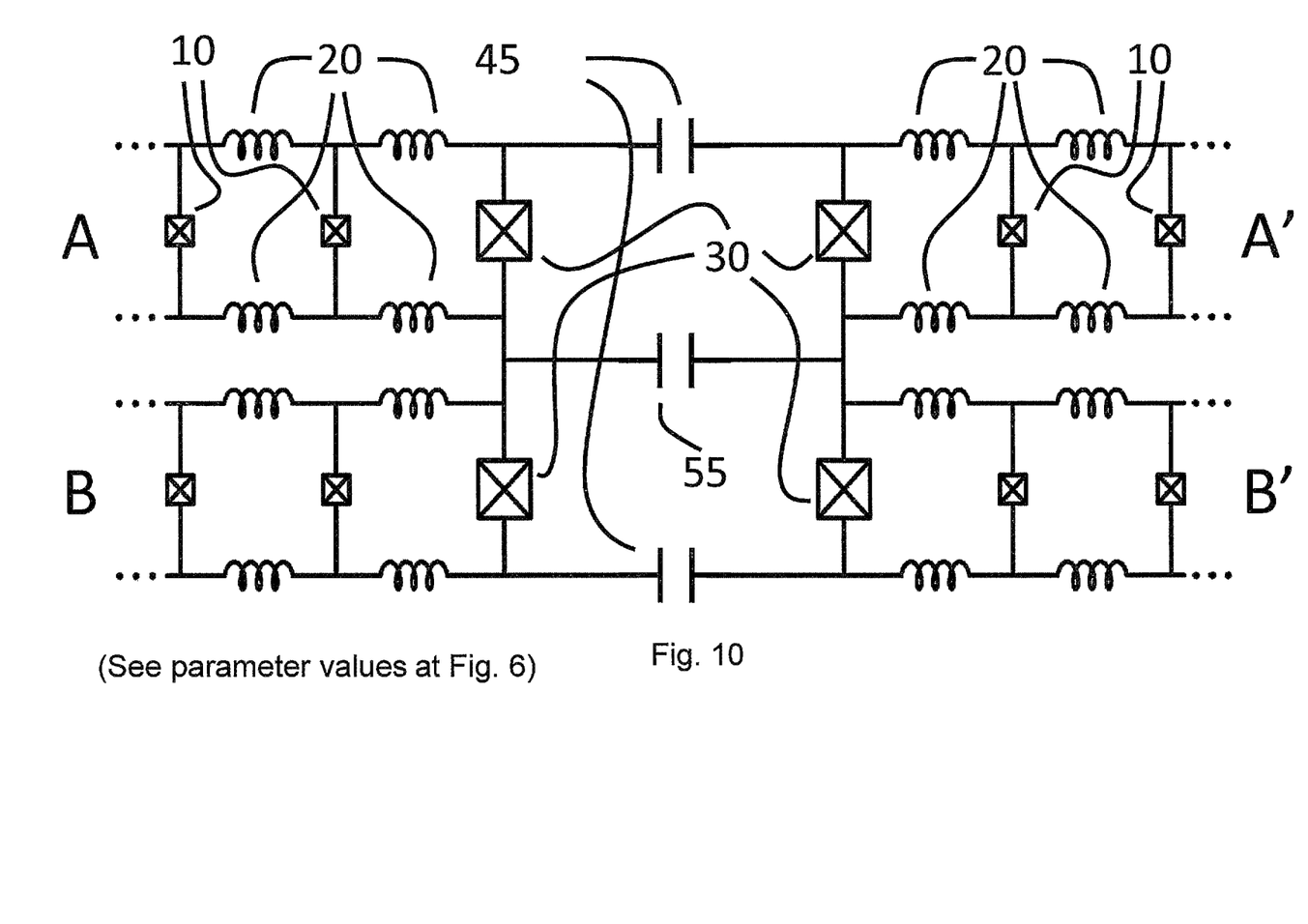
FIG. 10 is a circuit diagram of an IDSN gate in accordance with an embodiment of the present invention.

FIG. 6 also shows another usage of the IDSN, with parameter values and margins shown in section 605. According to this embodiment, illustrated in FIG. 10, the same schematic of FIG. 3 is followed, but JJs 40, 50 of FIG. 3 are replaced by shunt capacitors 45, 55 having capacitance values of $C_A$ and $C_B$, respectively. Thus values $I_{0A}$ and $I_{0B}$ are not provided in section 605. In addition to performing the IDSN function, this gate allows dc isolation between the left and right sides of the gate. This is an important design consideration, because in large logic circuits dc-isolation can prevent trapped flux from changing the gate operation.

Figure 8:
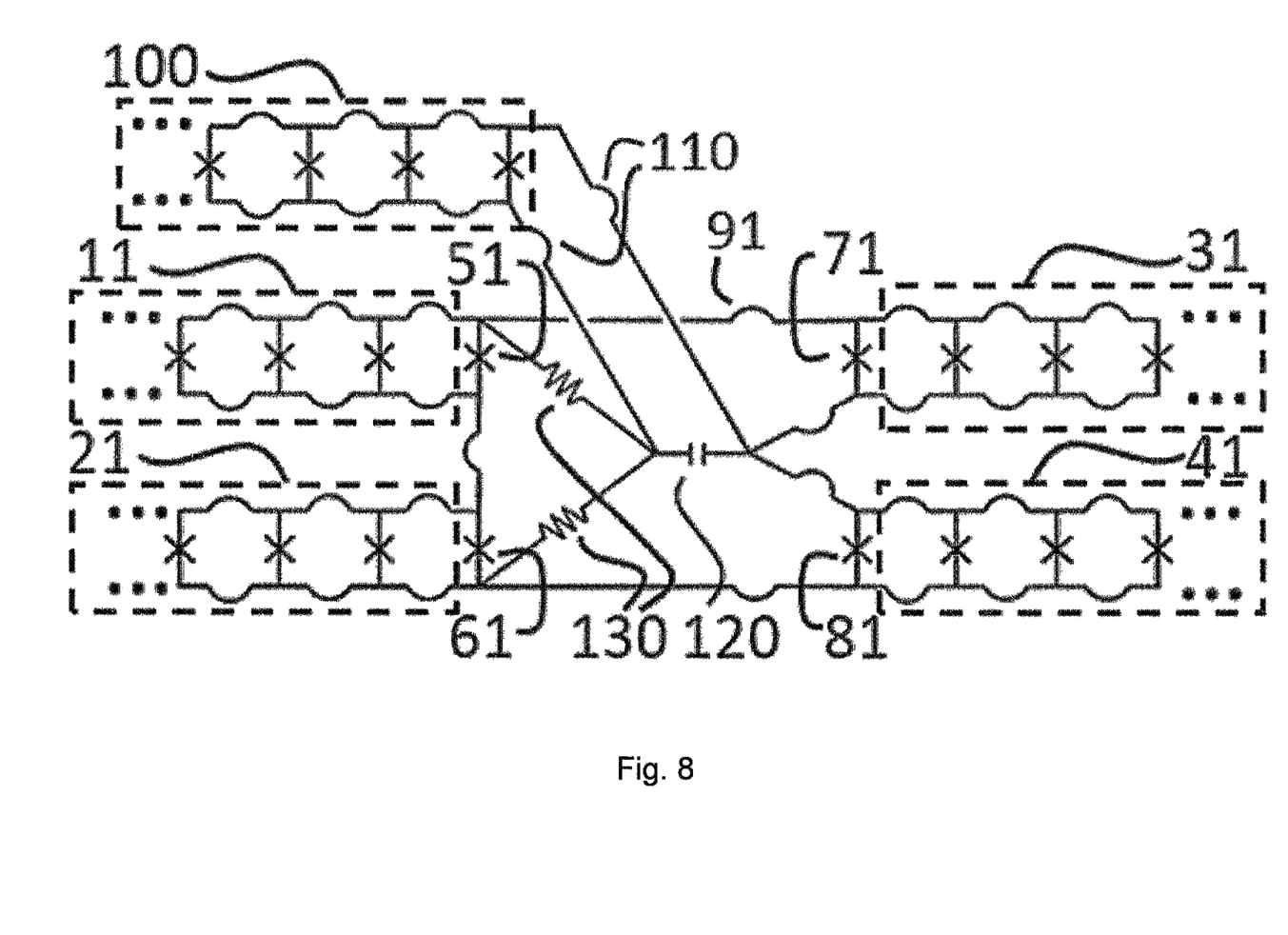
FIG. 8 is a circuit diagram of a store-and-launch (SNL) gate in accordance with an embodiment of the present invention.

A SNL (Store and Launch) schematic is shown in FIG. 8. A fluxon transfer device has previously been developed to stop and launch a fluxon along a single path (in and out). The SNL, however, allows launching at a specific time (clocking) and routing of fluxons (bits) according to their state. The gate function of the SNL is different than for ballistic gates because this gate is auxiliary to the ballistic gates which are more energy efficient. At first, one bit comes in along one LJJ, either 11 or 21 (but not both). The fluxon will eventually pass flux through csJJ 51 (if it entered through LJJ 11) or csJJ 61 (if it entered through LJJ 21).

As the fluxon approaches csJJ 51 it will change shape such that we call it a flux quanta as it enters. It enters through csJJ 51 and significant flux is stored in a loop. In particular, it will eventually settle as a static flux in a loop that includes csJJs 51, 61, 71, and 81 and direct connecting inductive wires 91 with total inductance $L_B$. After energy optimization for the SNL gate operation over a range of input fluxon velocities, csJJ 51 will generally be designed with high critical current to store significant energy from the incoming flux quanta (which originated from the input fluxons). The stored current and flux is equal in magnitude but opposite in direction for the two data bit states. The gate has top-bottom symmetry with respect to the data LJJs. Therefore csJJ 51 and csJJ 61 have the same critical current. csJJ 71 and csJJ 81 have the same values as each other, and are also optimized as well.

As a clock fluxon arrives it converts into a more ordinary flux quanta (due to it no longer being deep within an LJJ) and connects to the rest of the SNL through wiring 110 with inductance $L_A$, capacitor 120 with capacitance C, and resistors 130 with resistance R. The flux of the clock flux quanta will exit through the capacitor. As it does so the circuit transfers energy to the stored bit or flux quanta. The connections of the clock LJJ within the LJJ impart opposite large currents to csJJ 71 and csJJ 81, and small (negligible) currents to csJJ 51 and csJJ 61. The former currents induce the stored flux to exit out of csJJ 71 or csJJ 81 into LJJ 31 or LJJ 41, respectively. This follows from the way the current from the stored flux may add to the current from the clock fluxon at either csJJ 71 or csJJ 81 and subtract for the other JJ.

Figure 9:
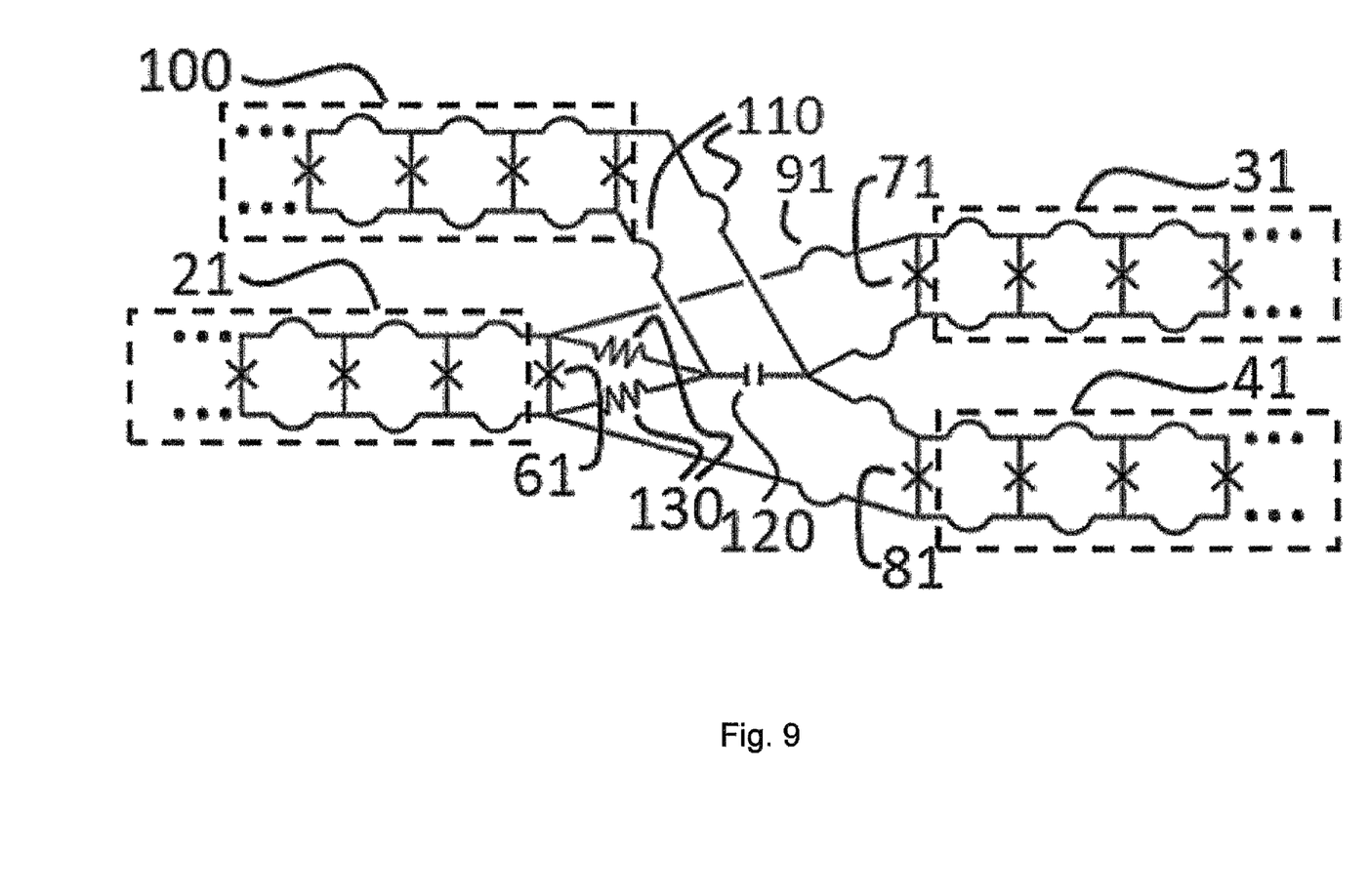
FIG. 9 is a circuit diagram of a store-and-launch gate in accordance with an embodiment of the present invention.

While the gate illustrated in FIG. 8 includes two input LJJs 11, 21, the SNL also may be implemented using a single input LJJ, where the removed LJJ input is replaced with a short. An example of this implementation is shown in FIG. 9. This will make the gate have reduced functionality (only one input relative to two) but also higher energy efficiency for optimized parameters. Both SNLs may be used to build other gates besides the CNOT, as it is a general timing and routing structure.

Although less efficient than the ballistic gates, we have found that the 2-input SNL gate can have 71% efficiency for an input fluxon velocity less than 40% of the Swihart velocity, using a clock fluxon that is at 40% of the Swihart velocity. It is much more efficient for the 1-input SNL Depending on the embodiment, certain acts, events, or functions of any of the methods described herein can be performed in a different sequence, can be added, merged, or left out altogether. Not all described acts or events are necessarily required for the practice of any claimed method. Moreover, in certain embodiments, acts or events can be performed concurrently, rather than sequentially.

While the above description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that may not provide all of the features and benefits set forth herein, as some features can be used or practiced separately from others. The scope of the invention is indicated by the appended claims rather than the foregoing description. All changes which come within the meaning and range of equivalency of the claims are to be embraced within their scope.

We claim:

1. A CNOT gate for use in a reversible fluxon logic circuit, the CNOT gate comprising:
   a clock line, configured to transmit an input clock fluxon;
   a splitter, connected to the clock line, configured to receive the input clock fluxon and to transmit a first clock fluxon and a second clock fluxon, wherein the first clock fluxon and the second clock fluxon are synchronized in time;
   a first store-and-launch gate (SNL), configured to receive the first clock fluxon from the splitter, to receive a first input fluxon from a first input line, and to transmit a first output fluxon, wherein the first output fluxon is transmitted at a time in accordance with the first clock fluxon, and wherein the first output fluxon is transmitted on an output line in accordance with a polarity of the first input fluxon and a polarity of the first clock fluxon;
   a second store-and-launch gate, configured to receive the second clock fluxon from the splitter, to receive a second input fluxon from a second input line, and to transmit a second output fluxon, wherein the second output fluxon is transmitted at a time in accordance with the second clock fluxon, and wherein the second output fluxon is transmitted on an output line in accordance with a polarity of the second input fluxon and a polarity of the second clock fluxon;
   a first IDSN gate, configured to:
      receive up to two fluxon inputs;
      in the event exactly one fluxon input is received, output exactly one fluxon in accordance with a polarity of the exactly one fluxon input of the first IDSN gate; and
      in the event two fluxon inputs of the same polarity are received, output two fluxons in accordance with an inverse polarity of the two fluxon inputs of the first IDSN gate;

a second IDSN gate, configured to:
in the event exactly one fluxon input is received, output exactly one fluxon in accordance with a polarity of the exactly one fluxon input of the second IDSN gate; and
in the event two fluxon inputs of the same polarity are received, output two fluxons in accordance with an inverse polarity of the two fluxon inputs of the second IDSN gate;
a first NOT gate and a second NOT gate, each configured to receive a fluxon output from the first IDSN gate and to output a fluxon of opposite polarity from what was received; and
a third NOT gate configured to receive a fluxon output from the second IDSN gate and to output a fluxon of opposite polarity from what was received;
wherein the inputs of the first store-and-launch gate and the second store-and-launch gate and the outputs of the first IDSN and the second IDSN implement a CNOT function.

2. A CNOT gate in accordance with claim 1, wherein each of the first IDSN gate and the second IDSN gate comprises:
a first input Long Josephson Junction (LJJ) having first and second output terminals;
a second input LJJ having first and second output terminals, wherein the first output terminal of the second input LJJ is shorted to the second output terminal of the first input LJJ;
a first output LJJ having first and second input terminals;
a second output LJJ having first and second input terminals, wherein the first input terminal of the second output LJJ is shorted to the second input terminal of the first output LJJ;
a first capacitance-shunted Josephson Junction (csJJ) connected to the first and second output terminals of the first input LJJ;
a second csJJ connected to the first and second output terminals of the second input LJJ;
a third csJJ connected to the first and second input terminals of the first output LJJ;
a fourth csJJ connected to the first and second input terminals of the second output LJJ;
a fifth csJJ connected to the first output terminal of the first input LJJ and the first input terminal of the first output LJJ;
a sixth csJJ connected to the second output terminal of the second input LJJ and the second input terminal of the second output LJJ; and
a seventh csJJ connected to the second output terminal of the first input LJJ and the second input terminal of the first output LJJ.

3. A CNOT gate in accordance with claim 1, wherein each of the first IDSN gate and the second IDSN gate comprises:
a first input Long Josephson Junction (LJJ) having first and second output terminals;
a second input LJJ having first and second output terminals, wherein the first output terminal of the second input LJJ is shorted to the second output terminal of the first input LJJ;
a first output LJJ having first and second input terminals;
a second output LJJ having first and second input terminals, wherein the first input terminal of the second output LJJ is shorted to the second input terminal of the first output LJJ;
a first capacitance-shunted Josephson Junction (csJJ) connected to the first and second output terminals of the first input LJJ;
a second csJJ connected to the first and second output terminals of the second input LJJ;
a third csJJ connected to the first and second input terminals of the first output LJJ;
a fourth csJJ connected to the first and second input terminals of the second output LJJ;
a fifth csJJ connected to the first output terminal of the first input LJJ and the first input terminal of the first output LJJ;
a sixth csJJ connected to the second output terminal of the second input LJJ and the second input terminal of the second output LJJ; and
a non-linear impedance connected to the second output terminal of the first input LJJ and the second input terminal of the first output LJJ, wherein the non-linear impedance comprises a seventh csJJ and a supplemental inductor connected to each other in series.

4. A CNOT gate in accordance with claim 1, wherein each SNL comprises:
a first input LJJ having first and second output terminals;
a second input LJJ having first and second output terminals;
a clock input LJJ having first and second output terminals;
a first output LJJ having first and second input terminals;
a second output LJJ having first and second input terminals; and
a superconducting wiring path configured to form a flux storage loop, wherein the superconducting wiring path includes:
wiring from the first output terminal of the first input LJJ to the first input terminal of the first output LJJ by a first inductor;
wiring from the second input terminal of the first output LJJ to the second terminal of a capacitor by a second inductor;
wiring from the first input terminal of the second output LJJ to the second terminal of the capacitor by a third inductor;
wiring from the second output terminal of the second input LJJ to the second input terminal of the second output LJJ by a fourth inductor; and
wiring from the second output terminal of the first input LJJ to the first output terminal of the second input LJJ by a fifth inductor;
wherein the flux storage loop includes launch circuitry configured to launch stored flux when a clock fluxon reaches the capacitor via the clock input LJJ, the launch circuitry including:
wiring from the first output terminal of the input clock LJJ to the second terminal of the capacitor by a sixth inductor;
wiring from the second output terminal of the input clock LJJ to the first terminal of the capacitor by a seventh inductor;
wiring from the first output terminal of the first input LJJ to the first terminal of the capacitor by a first resistor; and
wiring from the second output terminal of the second input LJJ to the first terminal of the capacitor by a second resistor.

5. A CNOT gate in accordance with claim 2, wherein a ratio of 1) a critical current $I_0'$ of the first, second, third, and fourth csJJs to 2) a critical current $I_0$ within the first and second input LJJs and the first and second output LJJs has a value between 1.11 and 1.40.

6. A CNOT gate in accordance with claim 2, wherein a ratio of 1) a capacitance $Cj'$ within the first, second, third, and fourth csJJs to 2) a capacitance Cj within the first and second input LJJs and the first and second output LJJs has a value between 5.28 and 6.36.

7. A CNOT gate in accordance with claim 2, wherein a ratio of 1) a critical current $I_{0A}$ within the fifth and sixth csJJs to 2) a critical current $I_0$ within the first and second input LJJs and the first and second output LJJs has a value between 2.11 and 2.57.

8. A CNOT gate in accordance with claim 2, wherein a ratio of 1) a capacitance $C_A$ within the fifth and sixth csJJs to 2) a capacitance Cj within the first and second input LJJs and the first and second output LJJs has a value between 8.10 and 9.90.

9. A CNOT gate in accordance with claim 2, wherein a ratio of 1) a critical current $I_{0B}$ within the seventh csJJ to 2) a critical current $I_0$ within the first and second input LJJs and the first and second output LJJs has a value between 4.66 and 5.01.

10. A CNOT gate in accordance with claim 2, wherein a ratio of 1) a capacitance $C_B$ within the seventh csJJ to 2) a capacitance Cj within the first and second input LJJs and the first and second output LJJs has a value between 20.1 and 25.6.

11. A CNOT gate in accordance with claim 3, wherein a ratio of 1) a critical current $I_0'$ within the first, second, third, and fourth csJJs to 2) a critical current $I_0$ within the first and second input LJJs and the first and second output LJJs has a value between 0.80 and 1.94.

12. A CNOT gate in accordance with claim 3, wherein a ratio of 1) a capacitance Cj' within the first, second, third, and fourth csJJs to 2) a capacitance Cj within the first and second input LJJs and the first and second output LJJs has a value between 5.57 and 6.15.

13. A CNOT gate in accordance with claim 3, wherein a ratio of 1) a critical current $I_{0A}$ within the fifth and sixth csJJs to 2) a critical current $I_0$ within the first and second input LJJs and the first and second output LJJs has a value between 1.20 and 1.73.

14. A CNOT gate in accordance with claim 3, wherein a ratio of 1) a capacitance $C_A$ within the fifth and sixth csJJs to 2) a capacitance Cj within the first and second input LJJs and the first and second output LJJs has a value between 14.2 and 15.7.

15. A CNOT gate in accordance with claim 3, wherein a ratio of 1) a critical current $I_{0B}$ within the seventh csJJ to 2) a critical current $I_0$ within the first and second input LJJs and the first and second output LJJs has a value between 6.53 and 7.43.

16. A CNOT gate in accordance with claim 3, wherein a ratio of 1) a capacitance $C_B$ within the seventh csJJ to 2) a capacitance Cj within the first and second input LJJs and the first and second output LJJs has a value between 14.2 and 19.0.

17. A CNOT gate in accordance with claim 3, wherein a ratio of 1) an inductance $L_B$ within the supplemental inductor to 2) an inductance L within the first and second input LJJs and the first and second output LJJs has a value between 0.20 and 0.78.

18. A store-and-launch gate (SNL), comprising:
a first input LJJ having first and second output terminals;
a second input LJJ having first and second output terminals;
a clock input LJJ having first and second output terminals;
a first output LJJ having first and second input terminals;
a second output LJJ having first and second input terminals; and
a superconducting wiring path configured to form a flux storage loop, wherein the superconducting wiring path includes:
wiring from the first output terminal of the first input LJJ to the first input terminal of the first output LJJ by a first inductor;
wiring from the second input terminal of the first output LJJ to the second terminal of a capacitor by a second inductor;
wiring from the first input terminal of the second output LJJ to the second terminal of the capacitor by a third inductor;
wiring from the second output terminal of the second input LJJ to the second input terminal of the second output LJJ by a fourth inductor;
wiring from the second output terminal of the first input LJJ to the first output terminal of the second input LJJ by a fifth inductor;
wherein the flux storage loop includes launch circuitry configured to launch stored flux when energy from a clock fluxon reaches the capacitor via the clock input LJJ, the launch circuitry including:
wiring from the first output terminal of the input clock LJJ to the second terminal of the capacitor by a sixth inductor;
wiring from the second output terminal of the input clock LJJ to the first terminal of the capacitor by a seventh inductor;
wiring from the first output terminal of the first input LJJ to the first terminal of the capacitor by a first resistor; and
wiring from the second output terminal of the second input LJJ to the first terminal of the capacitor by a second resistor.

\* \* \* \* \*